April 2, 1963 S. HUNT 3,084,292

LINEAR DETECTOR CIRCUIT AND METHOD OF OPERATION

Filed May 8, 1959

INVENTOR
SEYMOUR HUNT
BY Eugene E. Geoffrey, Jr.
ATTORNEY

United States Patent Office 3,084,292
Patented Apr. 2, 1963

3,084,292
LINEAR DETECTOR CIRCUIT AND METHOD OF OPERATION

Seymour Hunt, Fairmont Ave., Chatham, N.J.
Filed May 8, 1959, Ser. No. 811,882
13 Claims. (Cl. 329—170)

This invention relates to electronic circuits and more specifically a new and improved circuit and method of operation for demodulating and amplifying electric signals.

Electronic circuits for amplifying and demodulating relatively weak signals generally require a number of successive stages of amplification in order to attain signal levels of reasonable magnitude with presently available tubes, transistors and the like. This is particularly true in the reception of electromagnetic wave energy in the radio and television field wherein relatively complicated circuits and tubes are required to provide the necessary amplification for received signals to attain efficient detection and a reasonably large audio signal which can be amplified to a normal listening level by one or two stages of amplification.

Furthermore present radio and television receiving equipment usually utilize either several tuned radio frequency amplifying stages or superheterodyne circuits requiring four or more tuned circuits to produce selectivity or sharpness of tuning necessary to separate stations in the broadcast bands. In tuned radio frequency receivers the selective circuits are preferably tuned by several condensers ganged to a single shaft while in superheterodyne circuits a condenser having at least two sections is required to independently tune both the input circuit and the mixer-oscillator stage. In addition the intermediate amplifier stage or stages of the superheterodyne must be tuned to resonate at the frequency produced by the mixer stage. In both types of receivers accurate alignment of all tuned circuits one with the others is an essential requirement that adds materially to the cost of production and maintenance of the equipment. Regenerative circuits have also been used in receivers but are unsatisfactory because of instability and the generation of radiating signals that interfere with the operation of other receivers in the vicinity.

Accordngly one object of the invention resides in the provision of a method and apparatus for amplifying and/or demodulating electronic signals particularly adaptable for use in radio receivers and characterized by simplicity, stability and low cost. This is attained in part through an improved circuit and operating procedure wherein high degrees of selectivity are secured with but a single tuned circuit feeding a single amplifying device acting as both a radio frequency amplifier and demodulator and produces a signal gain far in excess of the amplification factor of the amplifying device. Actual tests have indicated that a single triode tube for instance when functioning both as the radio frequency amplifier' and detector in a radio receiver in accordance with the invention will provide selectivity and signal level at least equivalent to superheterodyne circuits utilizing multi-grid tubes for the mixer oscillator stage and intermediate amplifier and a diode detector.

Another object of the invention is the provision of an improved demodulator for modulated signals characterized by its exceedingly high gain stability and linear detection.

A further object of the invention resides in a signal amplifying system utilizing an amplifying device, such as a vacuum tube, transistor or the like, and incorporating an improved mode of operation including highly stable positive feedback to attain high amplification without oscillation and a high degree of stability and dependability through the life of the amplifier.

A still further object of the invention is the provision of a high gain, high fidelity detector circuit that has a high degree of selectivity and stability and that will not generate and radiate electromagnetic or other signals.

Still another object of the invention is an improved linear demodulator for electronic equipment characterized by the simplicity of its circuitry, its low cost and ease of manufacture, and its stability and dependability.

Still another object of the invention is an improved electronic circuit and method of operation.

The above and other objects and advantages of this invention will become more apparent from the following description and accompanying drawings forming part of this application.

As will be shown, the invention is useful as a detector for modulated radio frequency signals, as well as an amplifier for modulated or un-modulated radio frequency signals. While the description will refer generally to the amplification and demodulation of radio frequency signals, it is to be understood that it is useful for signals of any frequency by selection of proper circuit components that may be readily accomplished by those skilled in the art following the teachings of this invention.

Figure 1:
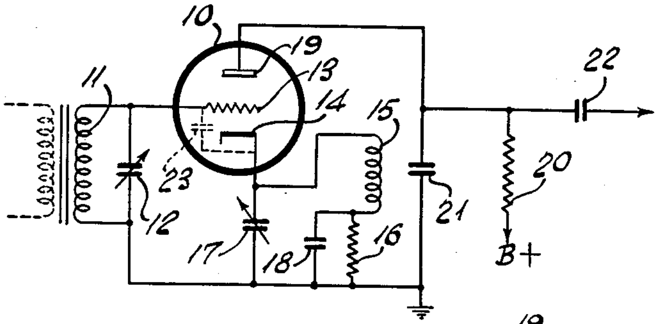
FIGURE 1 is a circuit diagram of a demodulator-amplifier in accordance with the invention.

Referring first to FIG. 1, there is illustrated a detector circuit having a triode vacuum tube 10, as for instance, one half of a 12AX7. It is advantageous to utilize a high gain tube though the advantages of this circuit may be realized with any triode. For purposes of this description let it be assumed that the detector is to be used for the AM broadcast range and that the signal to be detected and amplified appears across the RF coil 11, which may be an antenna loop or the secondary of an RF transformer. In the case of antenna loops, Q's of the order of 300 to 500 are desirable to provide a large input signal and afford a high degree of selectivity. A condenser 12 is connected across the coil 11 and may be fixed for single frequency operation or tunable for operation over a band of frequencies such as the broadcast band. It is to be understood that other types of resonant input devices may be employed.

The signal in the coil 11 is fed to the tube 10 by connection of one side of the coil 11 and condenser 12 to the grid 13 and the other side of the coil and condenser to ground. The cathode 14 is connected to ground through an inductor 15 and resistor 16. A condenser 17 is connected between the cathode 14 and ground and a relatively large capacity condenser 18 is connected in parallel with the resistor 14. The condenser 18 should have negligible impedance to both audio and radio frequencies. The plate 19 is connected to a source of positive voltage B+ through a load resistor 20 and is also bypassed to ground by condenser 21. The demodulated signal is obtained from the plate through the condenser 22 and may be fed to any suitable transducer or audio amplifier.

For its operation this detector circuit may rely on the interelectrode capacitance of the tube 10 and, more specifically, the capacity between the grid 13 and cathode 14. If desired an external capacitor may be employed, though the interelectrode capacitance as represented by the condenser 23 in dotted outline has been found to function satisfactorily for the purpose to be described.

In the adjustment of the components of this circuit to effect operation in accordance with the invention, the plate bypass condenser 21 is adjusted relative to the load resistor 20 to obtain the desired audio pass band and to bypass radio frequencies to ground. As a typical example, the audio load resistor may be of the order of 500,000 ohms while the plate bypass condenser 21 may be of the order of 200 to 2,000 mmfd. While these values are selected as values that will produce satisfactory operation, they may in fact be varied over wide ranges to obtain the desired operation characteristics.

The condenser 17 and the coil 15 forming part of the cathode circuit resonate at a frequency below the modulated frequency being detected and amplified. The resistor 16 is selected to produce bias on the grid 13 and with a 12AX7 operating with a 500,000 ohm load resistor in the plate circuit and a 100 volt B+ supply, the resistor should be of the order of 10,000 ohms. The voltage drop across this resistor under the typical conditions set forth above will bias the tube 10 as an audio amplifier. In order to prevent audio degeneration in the cathode circuit, a large condenser 18 bypasses the resistor 16. This condenser can be an electrolytic condenser of the order of 1 to 10 mfd. or greater.

With the circuit as outlined above and the coil 11 and condenser 12 adjusted to resonate at a predetermined radio frequency, the signal will be amplified by the tube 10 and cause plate current to flow in the circuit of the plate 19. This plate current obviously flows to the cathode circuit and a radio frequency voltage will appear across the condenser 17. Since we have arbitrarily selected the standard broadcast band as the range of frequencies in which the detector is to operate, the choke 15 may have a typical value of five millihenries, it being understood that the value of this choke must be such as to resonate with the finally selected value of the condenser 17 below the range of frequencies over which the detector is tunable. The RF voltage developed across the condenser 17 is fed through the interelectrode capacitance of the tube to the grid 13 and appears across the input circuit comprising the coil 11 and the condenser 12. The condenser 17 which may be adjustable may be varied until oscillation is produced in the circuit. This indicates an excessive amount of energy being positively fed back from the cathode to the grid and produces regeneration since the fed back voltage is substantially in phase with the input voltage appearing across the coil 11. The condenser 17 is now further adjusted to increase its capacity and thereby reduce the voltage being fed back to the grid until oscillation ceases. The circuit is now operating under regenerative conditions and as a result the amplitude of the signal appearing in the plate circuit of the tube exceeds the amplitude of the signal impressed on the grid by an amount greater than the amplification factor of the tube. In addition, detection is accomplished and the demodulated signal appears across the load resistor 20 notwithstanding the fact that the tube 10 is merely bypassed as an audio amplifier.

In the operation of this circuit to obtain both amplification and detection, it is believed that the signal developed across the condenser 17 and fed back to the grid 13 beats with the original signal developed across the coil 11 and condenser 12 to effect detection in the nature of product detection. At the same time, the introduction of the second voltage, produced across the condenser 17, into the grid circuit produces regeneration as described above to increase the overall gain of the circuit substantially above that normally obtained by the amplification of the tube itself. This regeneration also increases the Q of the tuned circuit including the coil 11 and condenser 12, thus greatly enhancing the selectivity. The selectivity of the circuit may be further improved by the adjustment of the condenser 21, since increasing the size of the condenser 21 will tend to bypass the higher audio frequencies and reduce interstation crosstalk. For clarity, it may be said that audio cutoff in the plate circuit as produced by the condenser 21 in combination with the resistor 20 is mirror-imaged in the input circuit selectivity and in this way can be used to modify the selectivity of the detector. Under certain conditions it may also be desirable to include an RF choke in the output circuit to prevent radio frequency signals from entering any transducer or audio amplifier to which the demodulated signal may be fed.

It is to be understood, however, that inasmuch as the RF current flowing in the plate circuit will be a function of both condensers 21 and 17, that after the value of the condenser 21 has been selected, the value of the condenser 17 must be adjusted accordingly to produce the desired feedback voltage.

Known product detectors usually employ a multi-grid tube in which the signal to be demodulated is fed to one grid and a separate oscillator supplying a second signal at the carrier frequency is fed to the second grid. The beats between these two signals within the tube itself function to produce demodulation. In the circuit in accordance with this invention, however, the separate oscillator signal is not employed and the fed back signal which was developed across the condenser 17 is believed to act in the nature of the separate oscillator signal at carrier frequencies but with two signals being applied to the same grid. Thus, with a single tube 10 this circuit affords a high degree of selectivity and gain and at the same time affords linear product detection for faithful reproduction of the demodulated signal. When a high Q antenna loop is used as the coil 11, the audio response will be affected by the sharpness of resonance. It will also be understood that detection of FM signals can be accomplished by tuning the coil 11 and condenser 12 so that the circuit is slightly off resonance. In this way the FM signal is converted to an AM signal and then detected, as described above.

Figure 2:
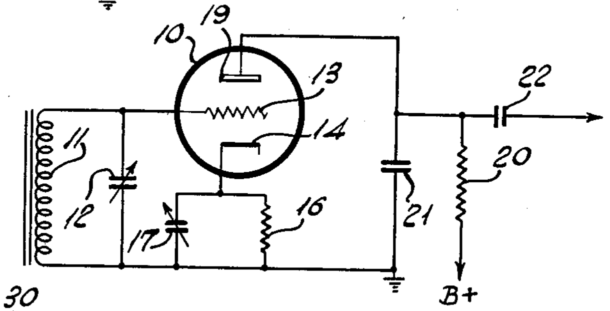
FIGURE 2 is a circuit diagram of a modified demodulator-amplifier in accordance with the invention.

FIGURE 2 illustrates a slightly modified circuit in that the choke 15 and the condenser 18 are omitted from the circuit of the cathode 14. For convenience, corresponding elements in both FIGS. 1 and 2 are denoted by like numerals. The simplified conversion shown in FIG. 2 utilizes the resistor 16 to provide audio bias on the cathode 14 and the condenser in parallel with the resistor 16 functions in identical manner to the condenser 17 of FIG. 1. Since the resistor 16 is not heavily by-passed as in the circuit shown in FIG. 1, audio degeneration will occur but at the same time the circuit will regenerate at radio frequencies. In all other respects the circuit operation is substantially identical with that illustrated and described in connection with FIG. 1.

While cathode resistors have been illustrated in FIGS. 1 and 2 for producing the desired grid bias for operation of the tubes, it is apparent that other suitable forms of biasing may be employed. Furthermore, directly heated filament-type tubes may be used in place of the cathode type tubes.

Figure 3:
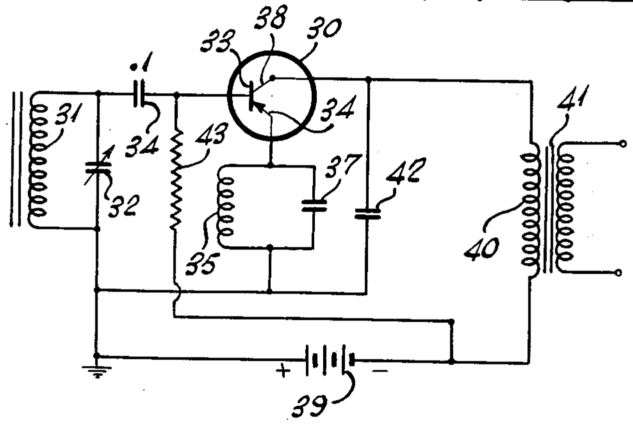
FIGURE 3 is a circuit diagram of a transistor demodulator amplifier in accordance with the invention.

The circuits as thus far described are useful with other types of amplifying devices such as transistors, as illustrated in FIG. 3. In this figure the transistor is denoted generally by the numeral 30 and may be of any suitable type for use at RF frequencies for which the circuit is designed to operate. The input signal, as in the case of the prior embodiments of the invention, is developed across the resonant input circuit including the coil 31 and the condenser 32. If the circuit is to be operated over a wide band of frequencies, an adjustable condenser 32 is provided. The input signal is fed to the base 33 through a fairly large condenser 34 which, in the conventional broadcast band of frequencies may be of the order of .1 mfd. The emitter 34 which corresponds to the cathode of a vacuum tube is connected to the ground through the inductor 35 and a condenser 37, the latter corresponding relatively to the inductor 15 and the condenser 17 at FIG. 1. Since the transistor illustrated in this figure is of the NPN type, the collector 38, which corresponds to the plate of a vacuum tube, is returned to the negative side of the battery 39 through the primary 40 of a transformer 41. Since transistors are generally essentially low impedance devices, it is more efficient to utilize a transformer such as the transformer 41 having a relatively low D.C. resistance in order to reduce the voltage drop therein, though it is evident that a resistive load may be used.

The collector 38 is bypassed to ground by a condenser 42 which corresponds to the condenser 21 of FIG. 1. This condenser in the illustrated embodiment may have a typical value of .1 to .5 mfd., though its value is determined by the frequency at which the circuit is to operate and the audio band width desired. The positive side of the battery 39 is returned to ground and a negative bias is applied to the base 33 by a resistor 43 connecting the base to the negative side of the battery 39. A satisfactory value for the resistor 43 would be approximately 1 megohm, though it may be varied over wide ranges as would be evident to those skilled in the art.

The operation of this circuit is substantially identical to the circuits described in FIGS. 1 and 2. The transistor as in the case of the vacuum tube, is preferably biased as an audio amplifier and detection and regeneration occur as described in connection with the vacuum tube version. For the purpose of this description and the accompanying claims, the base, emitter and collector correspond in function to the grid, cathode and plate of a vacuum tube. With a condenser of the order of 500 mmfd. bypassing the collector to ground, the emitter circuit coil 35 would be of the order of ½ to 1 millihenry, while the condenser 37 may be of the order of 500 mmfd. The previous embodiments of the invention utilize two separate signals on the grid of the tube or base of the transistor, as the case may be, to effect detection, though it is possible to realize the stable regenerative feature of this invention coupled with a modified form of detection as, for instance, plate detection by biasing the cathode or emitter to cutoff.

Figure 4:
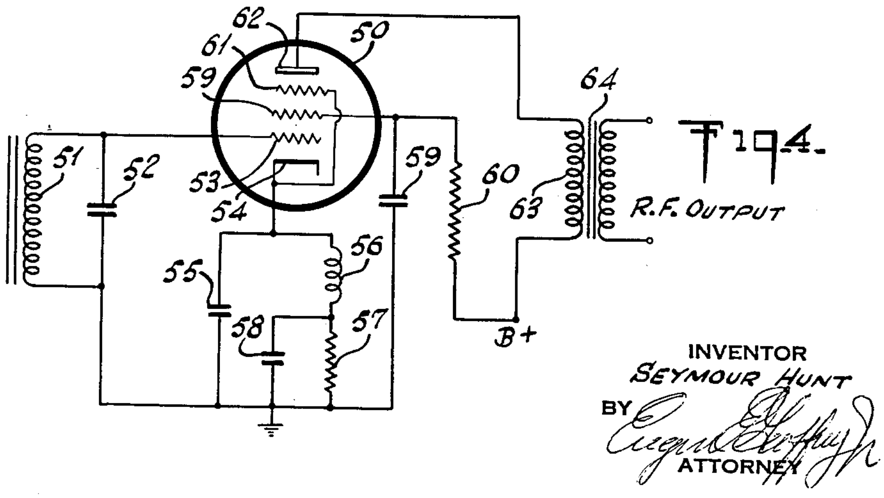
FIGURE 4 is a circuit diagram of a radio frequency amplifier in accordance with the invention.

The novel and improved regenerative feature of this invention is particularly useful independently of the detection for producing stable regeneration in radio frequency amplifiers and an example of one embodiment of such a regenerative radio frequency amplifier is illustrated in FIG. 4. For this purpose, referring specifically to FIG. 4, a screen grid tube 50 is employed. The RF signal to be amplified is developed across the input circuit which includes the coil 51 and condenser 52. One side of the coil and condenser is fed to the grid 53 while the other side is returned to the ground. The cathode 54 is connected to ground through a condenser 55 and is also connected to ground for DC through a coil 56 and a resistor 57, the latter being bypassed by a condenser 58 for radio frequencies. For instance, if the condenser 58 has a capacity of 1.0 mfd., then at 550 kilocycles, which is the lowest frequency in the broadcast band, the reactance is negligible; hence an insignificant voltage will be developed across it. The second grid 59 is bypassed to ground through condenser 59′ and is connected through a series dropping resistor 60 to a positive voltage denoted herein by B+. The suppressor grid 61 may be connected to the cathode 54 as illustrated, or returned directly to ground, as may be desired. The plate 62 is connected through the primary winding 63 of an RF output transformer 64 to B+.

The tube 50 including a cathode 54 and grids 53 and 59 and associated circuitry operates in substantially the same manner as described in connection with the circuits of FIGS. 1 and 2, with the value of condenser 59′ being adjusted to bypass substantially all of the RF from the screen circuit. A typical value for such a condenser is .05 mfd. with a normal value for screen dropping resistor 60. The condenser 55 is adjusted to produce regeneration without oscillation and the adjusted value of the condenser 55 should resonate with the coil 56 below the frequency being amplified.

The plate circuit which includes the primary 63 of the output transformer 64 has substantially zero reactance at audio frequencies and therefore even if the radio frequency being amplified carries some audio frequencies, such audio components will not appear across the winding 63. Hence, an amplified RF signal will be developed across the winding 63 and detection will not occur. The fact that product detection may occur by reason of the presentation to the grid 53 of two separate signals does not affect the plate circuit.

The circuits described above are useful throughout the entire range of radio frequencies, it being necessary of course, to modify the circuit components for producing desired operation at other radio frequencies. It is also understood that the specific values herein set forth are merely illustrative.

In each of the embodiments of the invention illustrated and described, an RF bypass condenser was connected either between the plate of a tube or the collector of a transistor and ground; while in the screen grid embodiment, from the screen grid to ground. The condenser bypassed a substantial portion of the radio frequencies to ground and therefore at radio frequencies the tube or transistor takes on certain characteristics of a cathode follower in which the major portion of the RF signal is developed in the cathode or emitter circuit. Under these conditions, the cathode impedance is relatively low, as for instance, in a conventional cathode follower, the impedance between cathode and ground is the plate resistance of the tube divided by $\text{M}u+1$ in shunt with the impedance in the cathode circuit. In the instant embodiment of the invention, the cathode load would be the condenser 17 of FIGS. 1 and 2, the condenser 37 of FIG. 3 and the condenser 55 of FIG. 4. These condensers are therefore the true cathode loads, since their associated coils have a relatively high reactance at the operating frequency. Thus, the cathode circuits form an exceedingly stable and stiff source of feedback voltage producing relatively little change with frequency by reason of the fact that it is substantially a cathode follower at radio frequencies. Furthermore, the cathode circuit, by reason of its resonance below the band of frequencies being amplified, always looks capacitive throughout the frequency range of the input circuit. Also, feedback is obtained through this novel and improved manner and does not load the input circuit, nor do adjustments of the input circuit affect the feedback circuit in such a way as to require readjustment of the feedback circuit for different frequency settings. Thus, a single setting of the cathode or emitter circuit condenser across which radio frequencies are developed will permit stable operation of the circuit over a wide frequency range, as, for instance, the entire AM broadcast band.

In the claims the terms "plate," "grid" and "cathode," normally used in connection with vacuum tubes, are intended to cover equivalent elements of other amplifying devices such as the collector, base and emitter of a transistor.

This application is a continuation-in-part of my application Serial No. 516,993, filed June 21, 1955 entitled "Electronic Device and Method of Operation," now abandoned.

While only certain embodiments have been illustrated and described, it is apparent that modifications, alterations and changes may be made without departing from the true scope and spirit as defined in the appended claims.

What is claimed is:

1. A detector and amplifier for modulated radio frequencies comprising an amplifying device having at least a plate, cathode and control element, a resonant input device connected to apply a modulated radio frequency signal between said control element and ground, means including an impedance for applying an operating voltage to said plate, a radio frequency bypass condenser connected between the plate and ground and bypassing part of the amplified radio frequency signal appearing at said plate, conductive impedance means connected between the cathode and ground, a cathode condenser having appreciable impedance at said radio frequency connected effectively between said cathode and ground, means for biasing the control element of said device effectively negative with respect to the cathode, the reactance of the last said condenser producing an appreciable radio frequency signal on the cathode and means including the capacity between the cathode and control eelment for feeding the last said R.F. signal to said control element in additive phase relation to the input signal fed from the resonant input device to said control element, the reactances of said condensers being proportional one relative to the other to maintain the magnitude of the regenerative radio frequency potential on the control element just below the point of oscillation.

2. A detector and amplifier according to claim 1 wherein said cathode circuit conductive impedance means includes a coil and wherein said coil and cathode condenser resonate at a frequency below that of the radio frequency being demodulated.

3. A demodulator and amplifier for modulated radio frequency signals comprising an amplifying device having at least an output terminal, an input terminal and a common terminal, an input circuit connected to apply a modulated radio frequency signal between said input terminal and a ground, means including an impedance for applying an operating voltage between ground and said output terminal, a radio frequency bypass condenser connected between said output terminal and ground and bypassing only part of the amplified radio frequency signal appearing at the output terminal, conductive impedance means connected between the common terminal and ground, a condenser having appreciable impedance at said radio frequency connected effectively between said common terminal and ground, means for biasing the input terminal of said device with respect to said common terminal the reactance of the last said condenser producing a radio frequency signal on said common terminal and means including the internal capacity of said amplifying device between the input and common terminals for feeding the last said RF signal to said input terminal in additive phase relation to the input signal fed from said input device to said control element.

4. A detector and amplifier circuit comprising an amplifying device having an input control electrode, an output control electrode, an electrode common to the input and output electrodes, means connected between said input electrode and a ground terminal for feeding a modulated RF signal to said amplifying device, means including a load for applying a voltage to said output electrode, a capacitive reactance connected between said output electrode and ground, a conductive impedance connecting said common electrode to ground, a capacitive reactance connected between said common electrode and ground, the last said capacitive reactance having appreciable impedance at the RF frequency applied to the input electrode to place the common electrode at an RF potential above ground and the first said capacitive reactance having substantially high impedance at said radio frequency to cause the output electrode to have an RF potential above ground, said capacitive reactance connected with said common electrode functioning effectively as an oscillator source to effect product detection of the signal and regeneration to increase the gain of the amplifying device.

5. An amplifier circuit comprising an amplifying device having at least three elements including at least an input control electrode, a common electrode and at least one other electrode, means applying a signal to be amplified between said control electrode and a ground terminal, a conductive impedance connecting said common electrode to said ground terminal, a capacitive reactance connected between said common electrode and ground terminal in parallel with said conductive impedance, means including an impedance for applying a voltage to said other electrode with reference to said ground terminal and a second capacitive reactance connected between said other electrode and the ground terminal, said capacitive reactances being related one relative to the other to effect controlled regeneration of said circuit below the point of oscillation, and said capacitive reactance connected with said common electrode functioning effectively as a source of signal potential and interacting with the signal applied to said control electrode to effect amplification of said signal through regeneration exceeding the rated gain of said amplifying device with said second capacitive reactance limiting the maximum regeneration.

6. An amplifier according to claim 5 wherein said other electrode comprises a second control electrode and said amplifying device further includes an output electrode and means including a load impedance and a source of voltage connected to said output electrode.

7. A detector and amplifier for modulated radio frequencies comprising an amplifying device having at least a plate, cathode and control element, a resonant input device connected to apply a modulated radio frequency signal between said control element and ground, means including an impedance for applying an operating voltage to said plate, a radio frequency bypass condenser connected between the plate and ground and bypassing part of the amplified radio frequency signal appearing at said plate, conductive impedance means connected between the cathode and ground, a cathode condenser having appreciable reactance at said radio frequency connected effectively between said cathode and ground, the last said condenser and conductive impedance being capacitively reactive at said radio frequency, means for biasing the control element of said device effectively negative with respect to the cathode, the last said condenser having a reactance to said radio frequency to produce a radio frequency signal on the cathode and means including the capacity between the cathode and control element for feeding the last said RF signal to said control element in additive phase relation to the input signal fed from the resonant input device to said control element.

8. A demodulator comprising an amplifying device housing an input electrode, a common electrode and an output electrode, means for applying a modulated radio frequency signal between said input electrode and a ground reference, a parallel connected condenser and conductive impedance connected between the ground reference and said common electrode and producing capacitive reactance at said radio frequency, means including a load impedance for applying an operating voltage to the output electrode, means biasing said input electrode with reference to said common electrode, said condenser having appreciable reactance at said radio frequency to place said common electrode at a radio frequency potential relative to ground, said potential being of an appreciable magnitude relative to the radio frequency signal applied to said input electrode, and means including the internal capacity of the device for feeding said radio frequency signal at said common electrode to said input electrode whereby the two said signals fed to said input electrode will interact to effect linear product detection with the demodulated signal appearing across said load impedance.

9. Means for demodulating radio frequency signals comprising an input device, an amplifying device having a control element, output means and a common element, means connecting said control element to said input device for applying the radio frequency signal in said input device to said control element, means including parallel connected condenser and conductive impedance means connected between the common element and ground, means including a load impedance and source of voltage connected with said output means, and means biasing said control element relative to said common element, said condenser having appreciable reactance at said radio frequency to produce a radio frequency signal at the common element and feed the last said signal to said control element in additive phase relation to the input signal fed from the resonant input device to said control element, the reactance of said condenser at the operating radio frequency being proportioned to maintain the magnitude of said radio frequency signal fed from the common element to the control element below the point of oscillation of the circuit.

10. Means for demodulating radio frequency signals according to claim 9 wherein said conductive impedance means is a resistor.

11. A detector comprising a triode vacuum tube having a grid, plate and cathode, a resonant device including an inductor tuned to a modulated radio frequency signal to be demodulated and connected between said grid and ground, a capacitive reactor connected between cathode and ground, a plate circuit including load impedance connected at one end to said plate and having means at the other end for connection to a potential having a ground reference, a condenser connected effectively between said plate and ground and having a reactance that will bypass a portion of the amplified radio frequency signal in the plate circuit means biasing the cathode relative to the grid, said cathode capacitive reactor having appreciable impedance at said radio frequency to raise the radio frequency potential of the cathode above ground, and means including interelectrode capacity between the grid and cathode for feeding the cathode radio frequency signal to said grid in additive relationship to the first said signal to produce a demodulated signal at the plate.

12. A detector comprising a transistor having a base, collector and emitter, an input device for applying a modulated radio frequency to said base, a condenser connecting one side of said input device to said base, a connection between the other side of said device and ground, a parallel connected impedance and condenser connected between said emitter and ground, a load of impedance connected between said collector and a source of potential having a ground reference, means biasing the base with respect to the emitter to cause said transistor to operate as a linear audio amplifier, said parallel connected impedance and condenser connected with said emitter having appreciable capacitive reactance at said radio frequency to raise the radio frequency potential of the emitter above ground, and means including the interelectrode capacity between said emitter and base to feed the emitter radio frequency signal to said base to effect detection of said modulated signal and produce regeneration of the detector.

13. A detector according to claim 12 wherein said conductive impedance means is a resistor.

References Cited in the file of this patent

UNITED STATES PATENTS

| | | |
|---|---|---|
| 2,038,879 | Willans | Apr. 28, 1936 |
| 2,345,511 | Thomas | Mar. 28, 1944 |
| 2,360,794 | Rankin | Oct. 17, 1944 |
| 2,789,219 | Butler | Apr. 16, 1957 |

FOREIGN PATENTS

| | | |
|---|---|---|
| 480,476 | Germany | Aug. 3, 1929 |

OTHER REFERENCES

Radio Physics Course by Ghirardi, New York 1933, Radio Technical Pub. Co., page 501.